US008760365B2

(12) United States Patent
Lee et al.

(10) Patent No.: US 8,760,365 B2
(45) Date of Patent: Jun. 24, 2014

(54) MULTI-DISPLAY APPARATUS AND METHOD THEREOF

(75) Inventors: Young-gu Lee, Yongin-si (KR); In-seo Kee, Yongin-si (KR); Ick-hwan Ko, Yongin-si (KR); Hong-shik Shim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 1090 days.

(21) Appl. No.: 11/851,815

(22) Filed: Sep. 7, 2007

(65) Prior Publication Data

US 2008/0224949 A1    Sep. 18, 2008

(30) Foreign Application Priority Data

Mar. 16, 2007    (KR) .......................... 10-2007-0026249

(51) Int. Cl.
*G09G 5/00*    (2006.01)

(52) U.S. Cl.
USPC ............................................. 345/1.3; 345/1.1

(58) Field of Classification Search
USPC ........................ 345/1.1–6, 156; 348/917–924; 349/134–160
See application file for complete search history.

(56) References Cited

U.S. PATENT DOCUMENTS

| 7,043,276 | B2 * | 5/2006 | Kokubo | 455/566 |
| 7,489,286 | B2 * | 2/2009 | Kawase et al. | 345/1.1 |
| 2002/0018027 | A1 * | 2/2002 | Sugimoto | 345/1.3 |
| 2003/0026068 | A1 * | 2/2003 | Tsai et al. | 361/683 |
| 2005/0099361 | A1 * | 5/2005 | Majer | 345/1.3 |
| 2005/0285811 | A1 * | 12/2005 | Kawase et al. | 345/1.1 |
| 2006/0250084 | A1 * | 11/2006 | Cok et al. | 313/512 |
| 2007/0040976 | A1 * | 2/2007 | Lee et al. | 349/134 |
| 2007/0139606 | A1 * | 6/2007 | Kim et al. | 349/158 |
| 2007/0172971 | A1 * | 7/2007 | Boroson | 438/26 |
| 2007/0252614 | A1 * | 11/2007 | Jeon | 324/770 |
| 2008/0169758 | A1 * | 7/2008 | Cok | 313/506 |

FOREIGN PATENT DOCUMENTS

| JP | 09-311344 A | 12/1997 |
| JP | 2003297550 A | 10/2003 |
| JP | 2004-037590 A | 2/2004 |
| JP | 2004-251981 A | 9/2004 |
| JP | 2005-017738 A | 1/2005 |
| JP | 2005017738 A | 1/2005 |
| JP | 2005-123153 A | 5/2005 |
| KR | 1020060048387 A | 5/2006 |

OTHER PUBLICATIONS

Korean Office Action with English Translation for Application No. 10-2007-0026249 dated May 23, 2013.

* cited by examiner

*Primary Examiner* — Vijay Shankar
(74) *Attorney, Agent, or Firm* — Cantor Colburn LLP (57) ABSTRACT

A multi-display apparatus includes two panels disposed with a step difference so that pixel boundaries of display devices formed on substrates overlap, and at least one of the two panels includes a thin film encapsulation layer covering the display device and disposed on an adjacent surface of one of the two panels where there is the step difference to improve a disconnection of an image at a seam between the two panels, and mitigate a perspective difference of the image at the seam due to the step difference between the two panels, thereby realizing a large natural and smooth image.

17 Claims, 6 Drawing Sheets

MULTI-DISPLAY APPARATUS AND METHOD THEREOF

This application claims priority to Korean Patent Application No. 10-2007-0026249, filed on Mar. 16, 2007, and all the benefits accruing therefrom under 35 U.S.C. §119, the contents of which in its entirety are herein incorporated by reference.

BACKGROUND OF THE INVENTION

1. Field of the Invention

The present invention relates to a multi-display apparatus that realizes an image by connecting a plurality of panels, and a method thereof, and more particularly, to a multi-display apparatus that can minimize a disconnection of an image at seams of the multi-display apparatus, and a method thereof.

2. Description of the Related Art

Multi-display apparatuses realize a large screen by connecting a plurality of display panels. In the past, a large screen was realized by connecting a plurality of Braun tubes, also known as cathode ray tubes ("CRTs"), into a large TV. However, recently, due to an increasing demand for a large screen in small mobile apparatuses such as mobile phones or personal digital assistants ("PDAs"), apparatuses that realize the large screen by connecting flat panel displays, such as liquid crystal displays ("LCDs"), field emission displays ("FEDs"), plasma display panels ("PDPs"), and organic light-emitting diodes ("LEDs"), are being produced.

Figure 1:
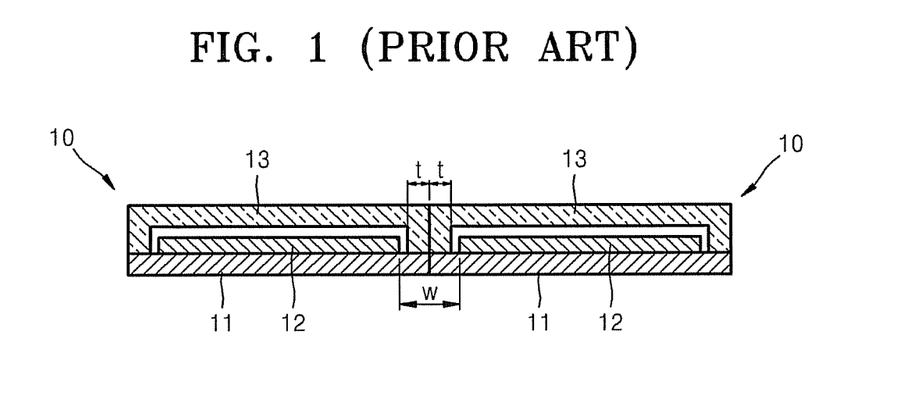
FIG. 1 is a cross-sectional view of a conventional multi-display apparatus of the prior art.

Conventionally, the multi-display apparatuses are manufactured by connecting unit panels 10 in parallel end to end to realize a multi-screen, as depicted in FIG. 1. However, an image at a seam between a pair of unit panels 10 is not smoothly formed but viewed as disconnected when the pair of unit panels 10 is connected. As schematically depicted in FIG. 1, a flat panel display has a sealing structure in which a display device 12 that forms a pixel is mounted on a substrate glass 11 and a cover glass 13 covering the display device 12 is attached to the substrate glass 11. As such, the cover glass 13 basically has a rim thickness t and the display device 12 is located on an inner portion of the cover glass 13. Therefore, an image separation of as much as a disconnection distance w occurs at the seam between the pair of display devices 12. The distance w cannot be reduced since the distance w is inevitably required for the cover glasses 13 to cover the adjacent display devices 12 in order to protect the display devices 12. Therefore, there is a limitation in improving the disconnection of an image at the seam between the pair of unit panels 10 in the above-described parallel connection structure.

Figure 2:
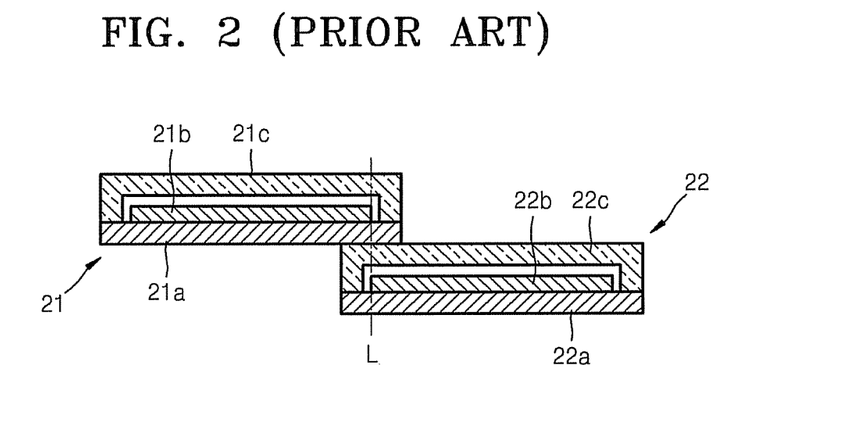
FIG. 2 is a cross-sectional view of another conventional multi-display apparatus of the prior art.

To overcome such limitation as described-above, as depicted in FIG. 2, a structure has been disclosed in which a pair of first and second unit panels 21 and 22 is disposed with a step difference and pixel boundaries between the pair of first and second unit panels 21 and 22 are vertically aligned along line L. Hence, after the pair of first and second unit panels 21 and 22 are disposed with the step difference as depicted in FIG. 2, a right side boundary surface of a pixel of a display device 21b of the first unit panel 21 is aligned with a left side boundary surface of a pixel of a display device 22b of the second unit panel 22 along vertical line L. In such form, the disconnection of an image at a seam between the pair of first and second unit panels 21 and 22 is minimized when the image is seen from above the pair of first and second unit panels 21 and 22.

When the pair of first and second unit panels 21 and 22 is disposed one on another as illustrated in FIG. 2, it is advantageous for ensuring the image connection. As an example of a unit panel, a top emission type unit panel in which light is emitted towards the covers 21c and 22c is shown in FIG. 2, and there is a height difference between the first and second unit panels 21 and 22. There is also height difference in a bottom emission type unit panel in which light is emitted towards the substrates 21a and 22a.

Furthermore, the multi-display apparatuses as described above are mostly manufactured in a folder type structure in which a pair of panels is connected with a hinge for mobile convenience. That is, when a multi-display apparatus is carried around, the pair of panels is folded, however, when the multi-display apparatus is used, the pair of panels are unfolded into one screen as depicted in FIG. 1 or 2.

BRIEF SUMMARY OF THE INVENTION

The present invention provides a multi-display apparatus that can simultaneously mitigate a disconnection of an image and its perspective difference in terms of becoming disconnected at a seam between panels.

According to exemplary embodiments of the present invention, there is provided a multi-display apparatus that displays a large image by connecting at least two panels, wherein first and second panels are disposed with a step difference so that pixel boundaries of display devices formed on substrates of the first and second panels, respectively, overlap, and at least one of the first and second panels includes a thin film encapsulation layer formed by stacking organic materials layers and inorganic material layers to cover the display device thereof and the thin film encapsulation layer is disposed on an adjacent surface of one of the first and second panels where there is the step difference.

According to other exemplary embodiments of the present invention, a multi-display apparatus includes a first panel including a first substrate and a first display device, and a second panel including a second substrate, a second display device, and a thin film encapsulation layer including an organic material layer and an inorganic material layer covering the second display device, wherein the first and second panels partially overlap each other and the thin film encapsulation layer of the second panel faces and contacts an overlapped portion of the first panel.

According to still other exemplary embodiments of the present invention, a method of improving a multi-display apparatus includes disposing a first display device on a first substrate of a first panel, disposing a second display device on a second substrate of a second panel, covering the second display device with a thin film encapsulation layer, and partially overlapping the first panel and the second panel, wherein the thin film encapsulation layer of the second panel faces and contacts an overlapped portion of the first panel.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 3:
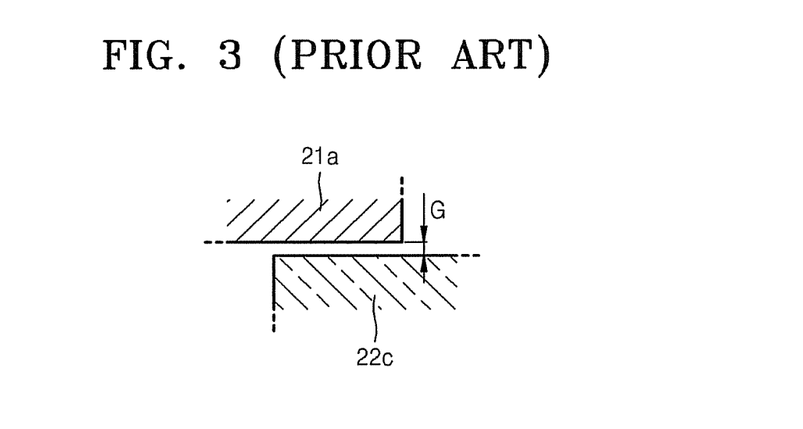
FIG. 3 is an enlarged cross-sectional view of an air gap formed between unit panels of the conventional multi-display apparatus of FIG. 2.

With reference again to FIG. 2, it is noted that there is a perspective difference in a connected image due to a large height difference between the first and second unit panels 21 and 22. That is, since the distances for the light respectively emitted from the unit panels 21b and 22b to reach the eyes of a user are different as much as the height difference between the first and second unit panels 21 and 22, as the height difference between the first and second unit panels 21 and 22 increases, the image cannot be viewed smoothly due to the perspective difference in the connected image. Additionally, it is noted that an air gap G between the pair of panels as depicted in FIG. 3 occurs even when a structural tolerance between the pair of panels is well matched when the stack layer type structure as depicted in FIG. 2 is manufactured. Accordingly, the perspective view of the image is further affected at the seam.

As will be described below, a multi-display apparatus that can mitigate a disconnection of an image and its perspective view in terms of becoming disconnected at a seam between panels of the multi-display apparatus is provided.

The present invention will now be described more fully with reference to the accompanying drawings in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention. Hereinafter, the present invention will be described in detail with reference to the accompanying drawings.

Figure 4A:
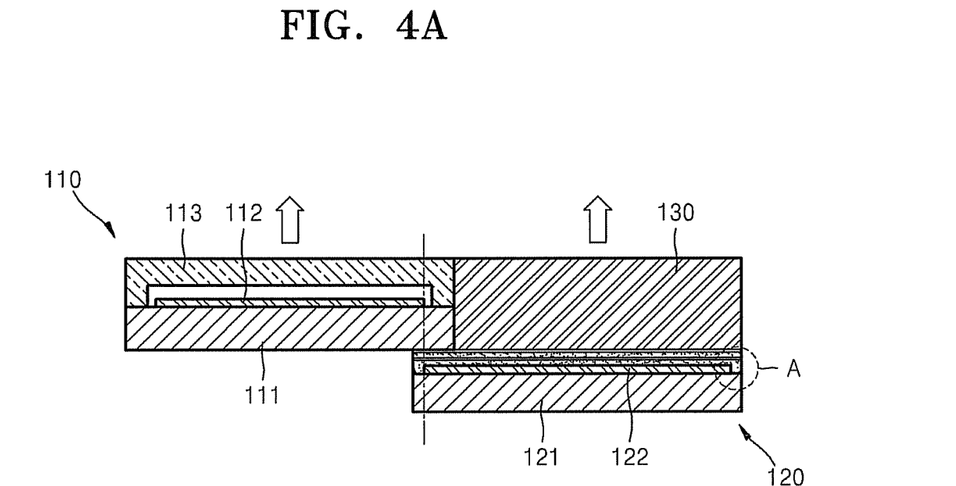
FIGS. 4A and 4B respectively are a cross-sectional view and an enlarged view of portion A of an exemplary multi-display apparatus, according to exemplary embodiments of the present invention.
Figure 4B:
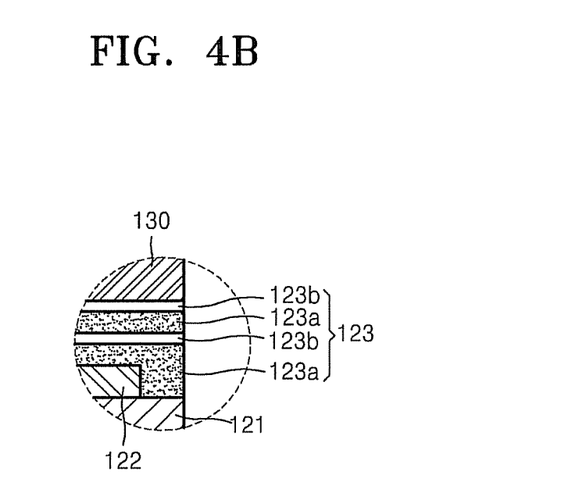
Figure 5:
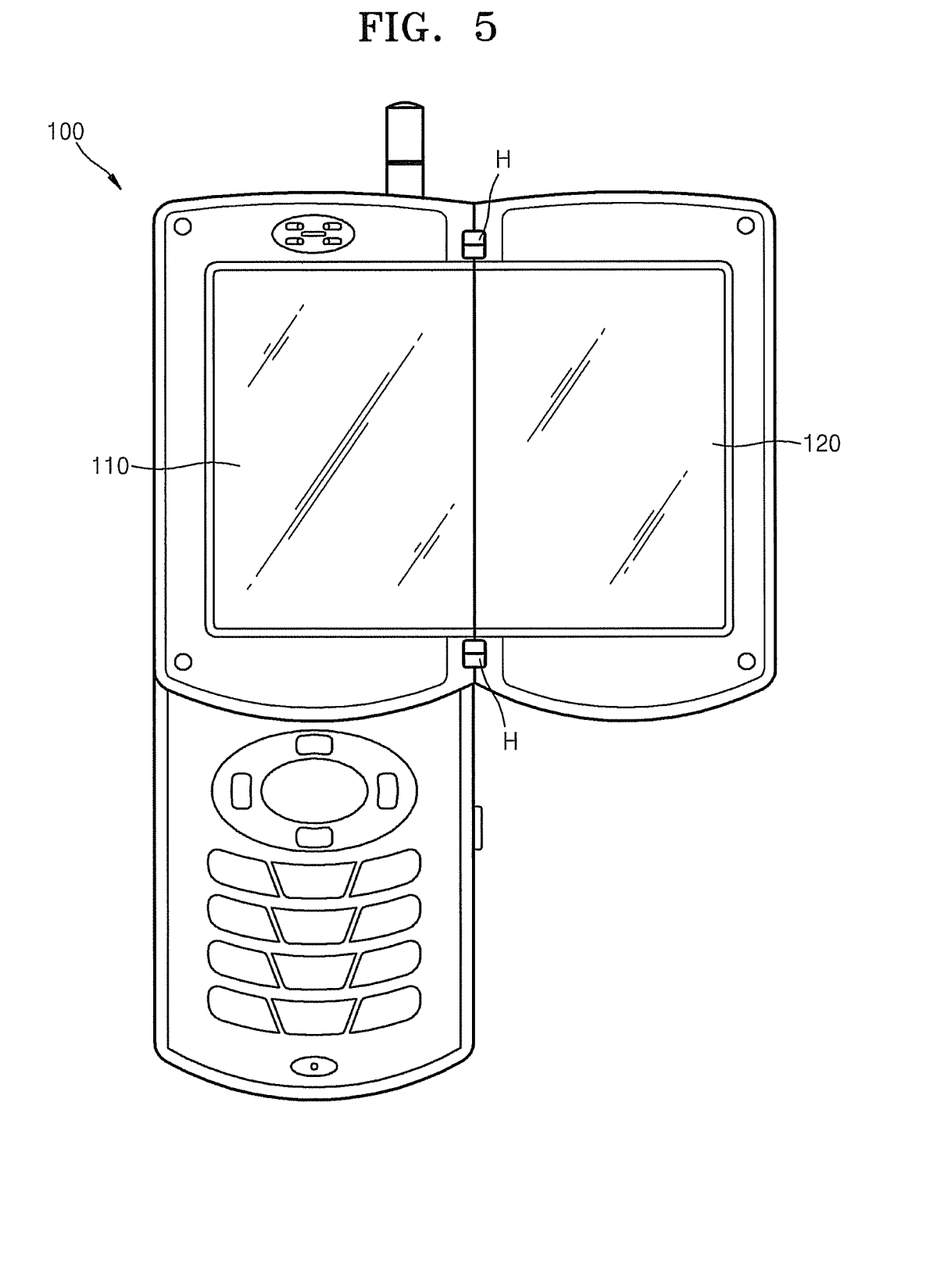
FIG. 5 is a perspective view of the exemplary multi-display apparatus of FIG. 4 in an exemplary application.

FIGS. 4A and 4B respectively are a cross-sectional view and an enlarged view of portion A of an exemplary multi-display apparatus 100 according to exemplary embodiments of the present invention, and FIG. 5 is a perspective view of the exemplary multi-display apparatus 100 of FIGS. 4A and 4B in an exemplary application. Even if the multi-display apparatus 100 can be made by connecting a plurality of panels, such as more than two panels, in various ways, in the present embodiment, for convenience of description, a case of connecting a pair of unit panels 110 and 120 will be described. Also, display devices 112 and 122 that display images are depicted in simplified forms.

From among the two unit panels 110 and 120, the unit panel 110 that is located on an upper side with respect to a light emission direction has a structure in which the display device 112, for displaying an image, is formed on a substrate 111 and a cover glass 113 is formed to cover and protect the display device 112 like a conventional display device structure. However, the other panel 120 located on a lower side with respect to a light emission direction has a structure in which a thin film encapsulation layer 123 is formed on a substrate 121, and the thin film encapsulation layer 123 buries the display device 122 in order to protect the display device 122. Hence, the display device 122 is not protected by covering the display device 122 with a cover glass like in the prior art, however, the display device 122 is protected by the thin film encapsulation layer 123 in which organic material layers 123a and inorganic material layers 123b, each having a thickness of a few microns are repeatedly stacked. The organic material layers 123a may be formed to a thickness in the range of about 0.01 to about 10 μm by depositing an organic material having flexibility such as polyurea or polyacrylate. The inorganic material layers 123b are each formed to a thickness in the range of about 0.001 to about 1 μm by depositing an inorganic material having high moisture proof characteristics such as $SiNx$, $Al_2O_3$, $SiO_2$, or $TiO_2$. The thin film encapsulation layer 123 formed in the manner described above has an overall thickness of a few tens of μm even if the organic material layers 123a and the inorganic material layers 123b are repeatedly stacked. The display device 112 is positioned closer to a display surface of the multi-display apparatus than the display device 122. However, as compared to the prior art in which the cover glass 113 having a minimum thickness of 1 mm is used, the height difference between the two unit panels 110 and 120 is greatly reduced even though the two unit panels 110 and 120 are disposed with a step difference. In this way, an image displayed on the two unit panels 110 and 120 can be smoothly connected and a perspective difference can be improved, thereby displaying a natural and smooth image.

The unit panel 120 includes a reinforcing member 130, and may be formed of transparent plastic, so that the top surface of the reinforcing member 130 is formed to be flush or substantially coplanar with the top surface of the unit panel 110. Thus, the display surface of the multi-display apparatus is formed by the top surface of the unit panel 110 and the top surface of the reinforcing member 130.

As depicted in FIG. 5, the two unit panels 110 and 120 are connected in a foldaway type form that can fold and open with respect to a hinge axis H to form a multi-display, and when the multi-display is opened, the two unit panels 110 and 120 have a step difference as depicted in FIG. 4A. The exemplary application of the multi-display apparatus 100 illustrated in FIG. 5 is that of a mobile phone; however other applications of the multi-display apparatus 100 are also within the scope of these embodiments.

Figure 6A:
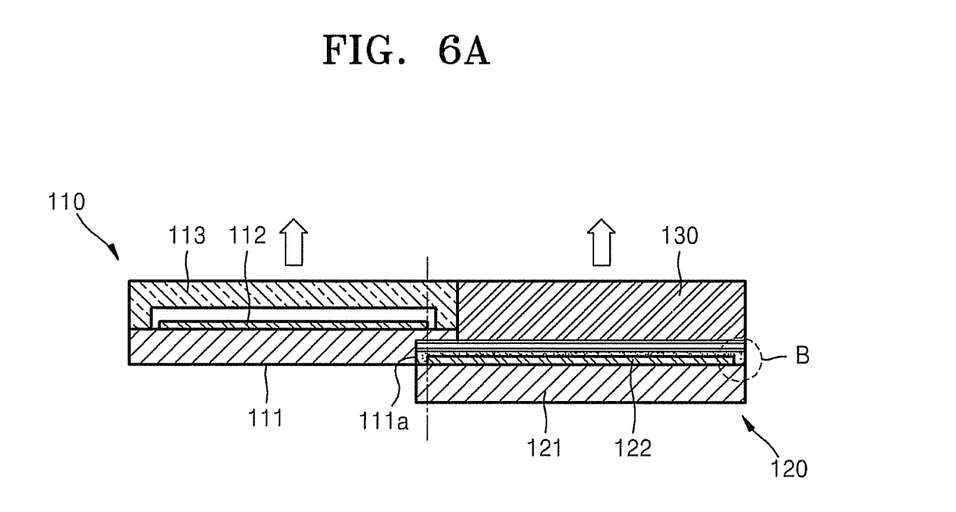
FIGS. 6A and 6B respectively are a cross-sectional view and an enlarged view of portion B of an exemplary multi-display apparatus according to another exemplary embodiment of the present invention.
Figure 6B:
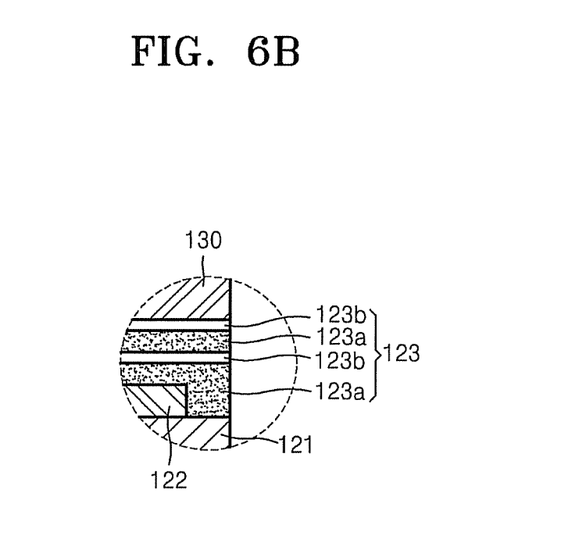

FIGS. 6A and 6B are respectively a cross-sectional view and an enlarged view of portion B of an exemplary multi-display apparatus according to another exemplary embodiment of the present invention. The multi-display apparatus according to the present embodiment has substantially the same configuration as the multi-display apparatus shown in FIGS. 4A and 4B, in which a height difference between the two unit panels 110 and 120 is reduced by using the unit panel 110 that uses the cover glass 113 and the unit panel 120 that uses the thin film encapsulation layer 123. However, an additional aspect of the multi-display apparatus according to the present embodiment shown in FIGS. 6A and 6B is that a portion of the substrate 111 of the unit panel 110 that contacts the thin film encapsulation layer 123 is etched to further reduce the height difference between the two unit panels 110 and 120. In other words, a distance from the display device 122 to the display surface of the multi-display apparatus of FIG. 6A is less than a distance from the display device 122 to the display surface of the multi-display apparatus of FIG. 4A. When the portion of the substrate 111 of the unit panel 110 is etched, a portion of the thin film encapsulation layer 123 can enter such etched portion 111a when the two unit panels 110 and 120 are disposed with a step difference, thereby further reducing the height difference between the two unit panels 110 and 120. The etched portion 111a may have an L-shaped cross-section to receive the edge corner portion of the unit panel 120.

Besides the above descriptions, the basic structure and the functions of the transparent plastic reinforcing member 130 and the other elements of the multi-display apparatus according to the present embodiment shown in FIGS. 6A and 6B may be identical to those of the unit panels 110 and 120 of FIGS. 4A and 4B. Thus, in the exemplary embodiment of FIGS. 6A and 6B, the perspective difference can be effectively reduced by reducing the height difference between the two unit panels 110 and 120.

Figure 7:
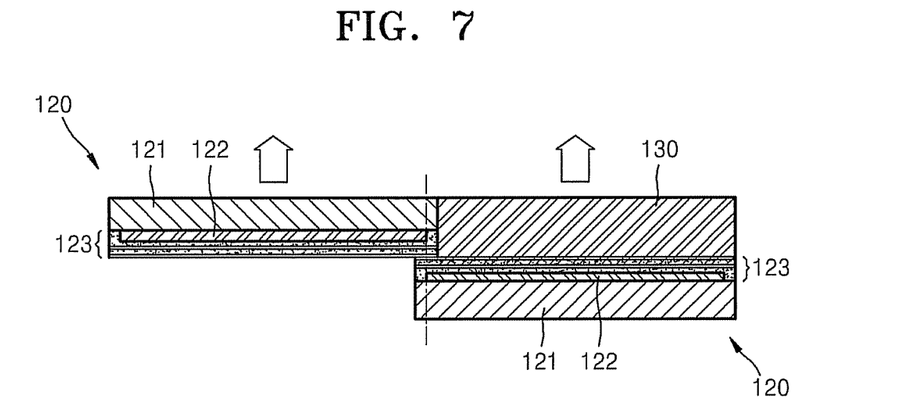
FIG. 7 is a cross-sectional view of an exemplary multi-display apparatus according to another exemplary embodiment of the present invention.

FIG. 7 is a cross-sectional view of an exemplary multi-display apparatus according to another exemplary embodiment of the present invention. An aspect of the multi-display apparatus according to the exemplary embodiment of FIG. 7 is that the multi-display apparatus has a structure in which two unit panels 120 are formed with the thin film encapsulation layer 123 and are adjacent to each other, such that the thin film encapsulation layers 123 of adjacent unit panels 120 face each other and contact each other. That is, in the previous embodiment, only one of the two unit panels 110 and 120 is formed with a structure having the thin film encapsulation layer 123. However, each of the two unit panels 120 according to the exemplary embodiment of FIG. 7 is formed with the thin film encapsulation layer 123 to further reduce the height difference between the two unit panels 120. Hence, even if the two unit panels 120 are disposed with a step difference by overlapping the two thin film encapsulation layers 123, each of the thin film encapsulation layers 123 has a thickness of a few tens of μm, thereby further reducing the height difference between the unit panels 120. However, in this case, since the thin film encapsulation layer 123 of the unit panel 120 on the left side of FIG. 7, such as a first unit panel 120, is located on a bottom part of the unit panel 120, a bottom emission type unit panel in which light is emitted towards the substrate 121 must be used for the first unit panel 120 on the left side of FIG. 7. For the unit panel 120 on the right side of FIG. 7, such as a second unit panel 120, light may be emitted towards the reinforcing member 130. That is, a display surface of the multi-display apparatus is formed by a surface of the substrate 121 substantially coplanar with a surface of the reinforcing member 130. Besides the above descriptions, the basic structure and the functions of the transparent plastic reinforcing member 130 and other elements of the multi-display apparatus according to the present embodiment may be identical or substantially the same to those of the unit panels 110 and 120 of FIG. 4.

Hence, according to the structure described above, since the thin film encapsulation layers 123, each having a thickness of a few tens of μm, form a step difference, the height difference between the unit panels 120 can be greatly reduced as compared to the prior art, thereby realizing a natural large image. While only two unit panels 120 are shown in FIG. 7, it would be within the scope of these embodiments to provide more than two adjacent and slightly overlapping unit panels 120 for the multi-display apparatus.

When the unit panels 110 and 120 are combined, further various other structures can be configured. Some examples of modified versions of multi-display apparatuses will now be described.

Figure 8:
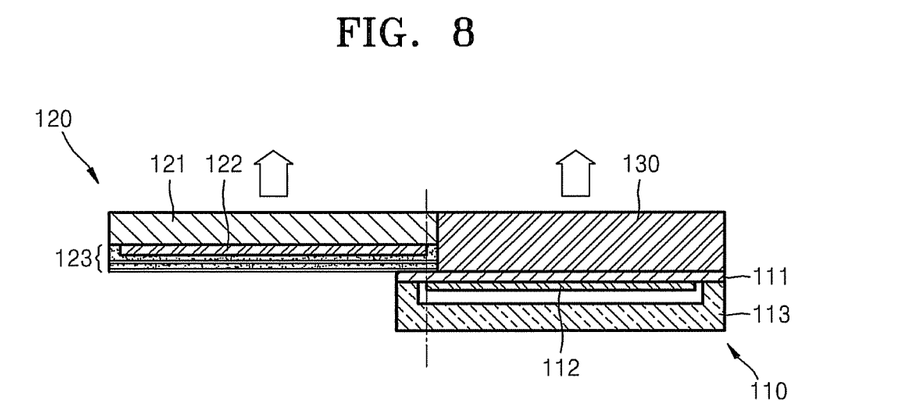
FIGS. 8 through 12 are cross-sectional views of modified versions of the exemplary multi-display apparatuses of FIGS. 4 through 7, according to other exemplary embodiments of the present invention.

FIGS. 8 through 12 are cross-sectional views of modified versions of the exemplary multi-display apparatuses of FIGS. 4 through 7, according to other exemplary embodiment of the present invention. In FIG. 8, an exemplary multi-display apparatus has a structure in which the exemplary multi-display apparatus of FIG. 4 is reversed. That is, the unit panel 120 located on an upper left side of the multi-display apparatus has a structure in which the display device 122 formed on the substrate 121 is protected by the thin film encapsulation layer 123, and the unit panel 110 located on a lower right side of the multi-display apparatus has a structure in which the display device 112 formed on the substrate 111 is protected by the cover glass 113. The thin film encapsulation layer 123 makes contact with the substrate 111 in an overlapping portion between the unit panels 120 and 110. The unit panels 110 and 120 in FIG. 8 form a bottom emission type panel in which light is emitted towards the substrates 111 and 121, respectively, (a panel in which light is emitted in a direction opposite to a substrate is a top emission type panel), and the unit panel 110 includes the transparent plastic reinforcing member 130 whose top surface is formed to be flush with the top surface of the substrate 121 of the unit panel 120. Also, an entire surface of the substrate 111 of the unit panel 110 located on a lower right side of the multi-display apparatus is etched to reduce the thickness of the substrate 111, thereby further reducing a height difference between the two unit panels 110 and 120.

Figure 9:
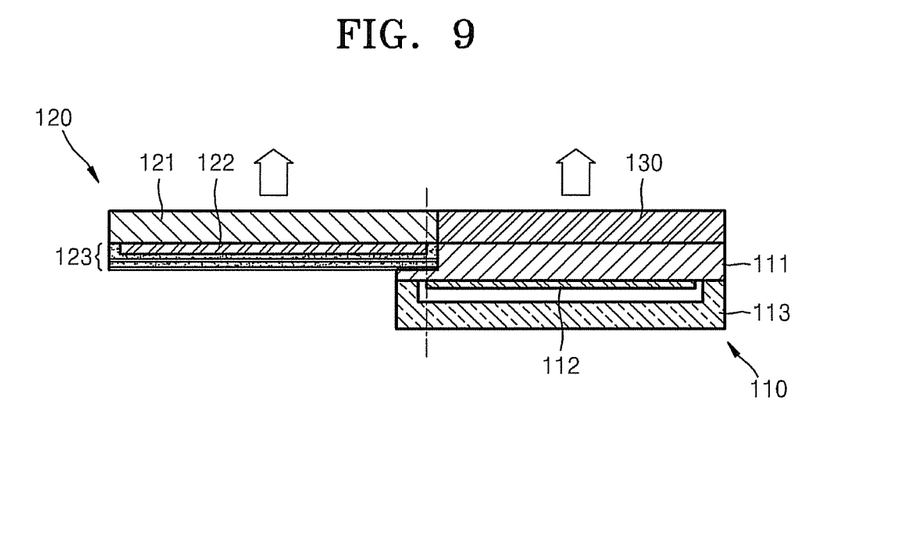

A multi-display apparatus depicted in FIG. 9 has a similar structure to the multi-display apparatus of FIG. 8. That is, the thin film encapsulation layer 123 of a unit panel 120 partially overlaps and contacts with the substrate 111 of an adjacent unit panel 110. In FIG. 8, the surface of the substrate 111 is entirely etched to become a substantially planar surface. However, in FIG. 9, a surface of the substrate 111 of the lower right unit panel 110 located on a lower right side of the multi-display apparatus is not entirely etched. Instead, a portion of the substrate 111, where the step difference is formed, is etched to reduce a height difference between the two unit panels 110 and 120. The etched portion may have a substantially L-shaped cross-section for receiving an edge corner portion of the unit panel 120.

Figure 10:
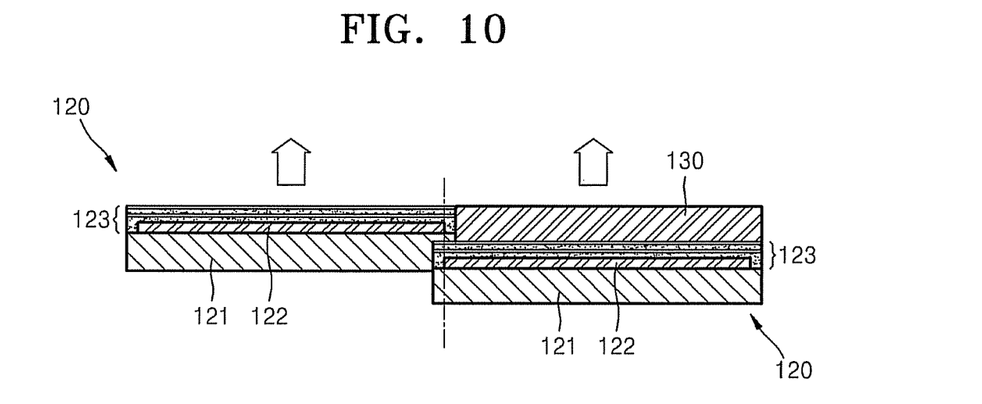

With reference to FIG. 10, an exemplary multi-display apparatus includes adjacent unit panels 120. Each of the unit panels 120 has a structure in which the display device 122 that is formed on the substrate 121 is covered and protected by the thin film encapsulation layer 123. The multi-display apparatus according to the exemplary embodiment of FIG. 10 is a top emission type panel in which light is emitted towards the thin film encapsulation layer 123. A portion of the substrate 121 of the unit panel 120 that is located on an upper left side of the multi-display apparatus, a first unit panel 120, is etched to reduce a height difference between the two unit panels 120. The etched portion of the substrate 121 of the first unit panel 120 may have a substantially L-shaped cross-section for receiving an edge corner portion of the unit panel 120 located on a lower right side of the multi-display apparatus, a second unit panel 120. A display apparatus of the multi-display apparatus of FIG. 10 includes a surface of the thin film encapsulation layer 123 substantially coplanar with a surface of the reinforcing member 130.

Figure 11:
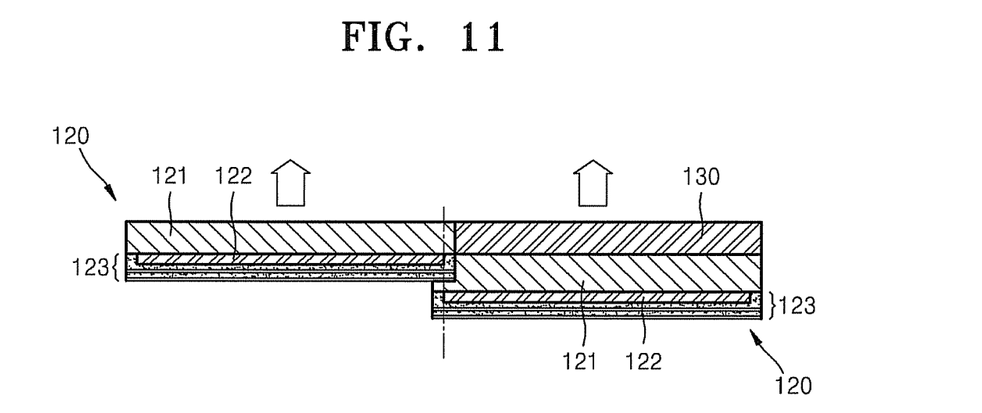

A multi-display apparatus of FIG. 11 is a reversed form of the multi-display apparatus of FIG. 10. A portion of the substrate 121 of the unit panel 120 located on a lower right side of the multi-display apparatus, a second unit panel 120, is etched to reduce a height difference between the two unit panels 120. In other words, the etched portion of the substrate 121 of the second unit panel 120 may have a substantially L-shaped cross-section to receive an edge corner portion of the first unit panel 120. The multi-display apparatus of FIG. 11 may be a bottom emission type panel.

Figure 12:
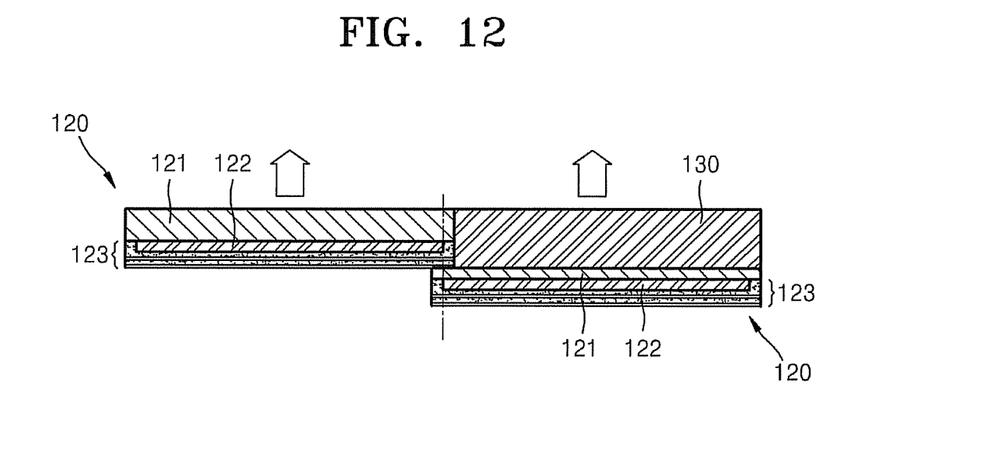

A multi-display apparatus of FIG. 12 has a similar structure to the multi-display apparatus of FIG. 11. In order to reduce a height difference between the two unit panels 120, an entire surface of the substrate 121 of the panel 120 located on a lower right side is etched instead of only etching a portion of the substrate 121 of the unit panel 120 located on the lower right side as illustrated in FIG. 11. In other words the substrate 121 of the unit panel 120 on the lower right side of the multi-display apparatus may be etched to be substantially planar, and thinner than the substrate 121 of the unit panel 120 on the upper left side of the multi-display apparatus.

As described above, various modified versions of multi-display apparatuses can be formed by appropriately combining the embodiments of the present invention, thereby improving a multi-display apparatus.

The display devices 112 and 122 described in the present invention can be various kinds of flat panel display devices such as liquid crystal displays ("LCDs"), field emission displays ("FEDs"), plasma display panels ("PDPs"), or organic light-emitting diodes ("OLEDs").

As described above, a multi-display apparatus according to the present invention can mitigate a disconnection of an image at a seam of panels and a perspective view of an image due to a step difference between the panels of the multi-display apparatus.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A multi-display apparatus that displays a large image by connecting at least two panels, the apparatus comprising:
   first and second panels disposed with a step difference such that a portion of the first panel overlaps the second panel and the first panel is located at an elevated position relative to the second panel in a direction corresponding to light emitting from the first and second panels, and a pixel boundary of a display device on a substrate of the first panel is aligned with a pixel boundary of a display device on a substrate of the second panel over the overlapped portion of the first and second panels,
   a thin film encapsulation layer including a stack of an organic material layer and an inorganic material layer to cover the display device of the at least one of the first and second panels, the thin film encapsulation layer disposed at least on the display device of one of the first and second panels to contact the other of the first and second panels, and
   a reinforcing member on the second panel, the reinforcing member configured to be flush with the first panel where the light emits therefrom.

2. The multi-display apparatus of claim 1, wherein the second panel is a top emission type panel having the thin film encapsulation layer, and the first panel is a top emission type panel in which the display device thereof is covered by a glass cover.

3. The multi-display apparatus of claim 1, wherein the second panel is a top emission type panel having the thin film encapsulation layer, and the first panel is a top emission type panel in which the display device thereof is covered by a glass cover, and a portion of the substrate of the first panel is etched to receive a corner edge portion of the second panel.

4. The multi-display apparatus of claim 1, wherein each of the first and second panels comprises a thin film encapsulation layer, wherein the second panel is a top emission type panel and the first panel is a bottom emission type panel, and the thin film encapsulation layers of the first and second panels contact each other.

5. The multi-display apparatus of claim 1, wherein the first panel is a bottom emission type panel having the thin film encapsulation layer, and the second panel is a bottom emission type panel in which the display device thereof is covered by a glass cover, wherein the substrate of the second panel contacts the thin film encapsulation layer and an entire surface of the substrate of the second panel is etched.

6. The multi-display apparatus of claim 1, wherein the first panel is a bottom emission type panel having the thin film encapsulation layer, and the second panel is a bottom emission type panel in which the display device thereof is covered by a glass cover, wherein the substrate of the second panel contacts the thin film encapsulation layer, and a portion of the substrate of the second panel is etched to receive a corner edge portion of the first panel.

7. The multi-display apparatus of claim 1, wherein the first and second panels are top emission type panels each having the thin film encapsulation layer, wherein the substrate of the first panel is disposed to be adjacent to the thin film encapsulation layer of the second panel, and, a portion of the substrate of the first panel is etched to receive a corner edge portion of the second panel.

8. The multi-display apparatus of claim 1, wherein the first and second panels are bottom emission type panels each having the thin film encapsulation layer, wherein the substrate of the second panel is disposed to be adjacent to the thin film encapsulation layer of the first panel, and, a portion of the substrate of the second panel is etched to receive a corner edge portion of the first panel.

9. The multi-display apparatus of claim 1, wherein the first and second panels are bottom emission type panels each having a thin film encapsulation layer, wherein the substrate of the second panel contacts the thin film encapsulation layer of the first panel, and an entire surface of the substrate of the second panel is etched.

10. The multi-display apparatus of claim 1, wherein the reinforcing member is formed of a transparent plastic.

11. The multi-display apparatus of claim 1, wherein the inorganic material layer includes one of a nitride, an oxide, and a carbonate.

12. The multi-display apparatus of claim 1, wherein the organic material layer has flexibility, and includes one of polyurea and polyacrylate.

13. The multi-display apparatus of claim 1, wherein the display device of each of the first and second panels is one of a liquid crystal display, field emission display, plasma display panel, and organic light-emitting diode.

14. The multi-display apparatus of claim 3, wherein the etched portion of the substrate includes a substantially L-shaped cross-section.

15. The multi-display apparatus of claim 6, wherein the etched portion of the substrate includes a substantially L-shaped cross-section.

16. The multi-display apparatus of claim 7, wherein the etched portion of the substrate includes a substantially L-shaped cross-section.

17. The multi-display apparatus of claim 8, wherein the etched portion of the substrate includes a substantially L-shaped cross-section.

* * * * *